US008272762B2

(12) United States Patent
Maxik et al.

(10) Patent No.: US 8,272,762 B2
(45) Date of Patent: Sep. 25, 2012

(54) LED LUMINAIRE (75) Inventors: Fredric S. Maxik, Indialantic, FL (US); Eliza Katar Grove, Satellite Beach, FL (US); James Schellack, Cocoa Beach, FL (US); Robert Soler, Cocoa Beach, FL (US); David E. Bartine, Cocoa, FL (US)

(73) Assignee: Lighting Science Group Corporation, Satellite Beach, FL (US)

( * ) Notice: Subject to any disclaimer, the term of this patent is extended or adjusted under 35 U.S.C. 154(b) by 0 days.

(21) Appl. No.: 13/247,117

(22) Filed: Sep. 28, 2011

(65) Prior Publication Data

US 2012/0075854 A1    Mar. 29, 2012

Related U.S. Application Data (60) Provisional application No. 61/387,189, filed on Sep. 28, 2010.

(51) Int. Cl.
    *F21S 4/00*    (2006.01)
(52) U.S. Cl. .................. 362/249.02; 362/294; 362/373; 362/646; 362/650
(58) Field of Classification Search ............. 362/249.01, 362/249.02, 294, 373, 249.11, 646, 649, 362/650; 313/40–47
    See application file for complete search history.

(56) References Cited

U.S. PATENT DOCUMENTS

| 6,220,722 | B1 * | 4/2001 | Begemann ............... 362/231 |
| 6,452,217 | B1 | 9/2002 | Wojnarowski et al. |
| 6,465,961 | B1 | 10/2002 | Cao |
| 6,499,860 | B2 * | 12/2002 | Begemann ............... 362/230 |
| 6,634,770 | B2 | 10/2003 | Cao |
| 6,635,987 | B1 | 10/2003 | Wojnarowski et al. |
| 6,746,885 | B2 | 6/2004 | Cao |
| 6,981,784 | B2 * | 1/2006 | Dubuc ...................... 362/331 |
| 7,847,471 | B2 * | 12/2010 | Liu et al. ................... 313/46 |
| 7,976,211 | B2 * | 7/2011 | Cao ......................... 362/650 |
| 8,115,369 | B2 * | 2/2012 | Kang et al. ................ 313/45 |
| 2010/0207502 | A1 * | 8/2010 | Cao et al. .................. 313/46 |
| 2010/0264799 | A1 * | 10/2010 | Liu et al. .................. 313/46 |
| 2011/0089830 | A1 * | 4/2011 | Pickard et al. ............. 315/32 |

FOREIGN PATENT DOCUMENTS

JP    2000149151    5/2000

* cited by examiner

*Primary Examiner* — John A Ward
(74) *Attorney, Agent, or Firm* — Cantor Colburn LLP (57) ABSTRACT A luminaire includes an electrical base, an optic, and a heat sink disposed between the base and the optic. An LED driver circuit is disposed at least partially within the heat sink, and is disposed in electrical communication with the base. An LED light source is disposed in thermal communication with one or more surfaces of the heat sink, and in electrical communication with the driver circuit, the LED assembly includes an LED module. The light source includes a printed circuit board with a plurality of projections that are bendable such that the projections are arranged on an angle when assembled on the heat sink.

18 Claims, 13 Drawing Sheets

LED LUMINAIRE

CROSS-REFERENCE TO RELATED APPLICATIONS

The present application claims priority to U.S. Provisional Application Ser. No. 61/387,189 entitled "LED Luminaire" filed on 28 Sep. 2010 which is incorporated by reference in its entirety.

BACKGROUND OF THE INVENTION

The subject matter disclosed herein relates generally to a luminaire having an LED light source, particularly to an LED luminaire sized to replace an incandescent light bulb, and more particularly to an LED luminaire sized to replace an A19 incandescent light bulb.

In recent years, there has been an increased interest in luminaires, sometimes referred to as "light bulbs" or lamps, which use light emitting diodes ("LEDs") as a light source. These luminaires are quite attractive since they overcome many of the disadvantages of the conventional light sources, which include incandescent light bulbs, fluorescent light bulbs, halogen light bulbs and metal halide light bulbs.

Conventional light sources, such as incandescent light bulbs for example, typically have a short useful life. As such, lighting systems commonly incorporate a fixture or "socket" that allows the light bulbs to be interchanged when the light bulb fails to operate. One type of socket, sometimes known as the E25 or E26 Edison base, meets the criteria set by the American National Standards Institute (ANSI), such as the ANSI C78.20-2003 standard for 60 Watt A19 type bulbs. The wide adoption of this standard allows the interchangeability of light bulbs from a variety of manufacturers into lighting systems.

Luminaires have been proposed that allow the use of LED luminaires in lighting systems. However, LED luminaires tend to emit light in a more directional manner than a corresponding incandescent light bulb. Incandescent light bulbs typically emit light in all directions (360 degree spherical arc about the filament). Thus an incandescent light bulb in a lamp for example emits light outwardly into the room and downward toward the surface that the lamp is resting. This provides for both general ambient lighting and task lighting in a single bulb. An LED module in a luminaire by contrast typically emits light over an arc of 120-150 degrees. As a result, the LED luminaire may not provide a desired coverage of light for the user or its use may be confined to task lighting applications.

Accordingly, while existing LED luminaires are suitable for their intended purposes, improvements may be made in increasing the ability of the luminaire to distribute light over a wider area, while also providing a direct replacement for conventional incandescent bulbs.

This background information is provided to reveal information believed by the applicant to be of possible relevance to the present invention. No admission is necessarily intended, nor should be construed, that any of the preceding information constitutes prior art against the present invention.

BRIEF DESCRIPTION OF THE INVENTION

An exemplary embodiment of the invention includes a luminaire having an electrical base. A driver circuit is arranged in electrical communication with the base. A heat sink is disposed between the base and an optic, the heat sink having a plurality of first surfaces, each of the plurality of first surfaces being disposed non-planar with respect to each other. A light emitting diode (LED) light source is provided having a plurality of second surfaces disposed non-planar with respect to each other and disposed in thermal communication with a respective one of the plurality of first surfaces. The LED light source further includes a plurality of third surfaces opposite the plurality of second surfaces and having at least one LED member coupled thereon, each LED member being disposed in electrical communication with the driver circuit.

Another embodiment of the invention includes luminaire having an electrical base. A heat sink is coupled between the electrical base and an optic, the heat sink having a first surface on one end within the optic and a plurality of second surfaces disposed about the first surface wherein the plurality of second surfaces are on an 45-85 degree angle relative to the first surface. An LED light source having a plurality of third surfaces thermally is coupled to the plurality of second surfaces and a plurality of LED members operably coupled to the plurality of third surfaces. Wherein at least one of the plurality of LED members is associated with each of the plurality of third surfaces.

Another embodiment of the invention includes a luminaire having an electrical base. A heat sink is coupled between the electrical base and an optic, the heat sink having a first portion disposed within the optic and a second portion having a plurality of ribs, the first portion having a plurality of first surfaces disposed at a 45-85 degree angle relative to a plane perpendicular to a longitudinal axis. An LED light source is thermally coupled to the heat sink, the LED light source comprising a printed circuit board (PCB) and a plurality of LED members, the PCB having at least three second surfaces, each of the second surfaces being disposed at an angle substantially parallel to and in thermal contact with one of the plurality of first surfaces.

Another embodiment of the invention includes a method of fabricating an LED assembly for a luminaire. The method includes the step of forming a flat PCB having a first side and a second side. The flat PCB is scored on the first side to define a plurality of surfaces. A plurality of LED members are mounted to the flat PCB, wherein at least one of the plurality of LED members is mounted to each of the plurality of surfaces. The plurality of projections are bent to a predefined angle.

BRIEF DESCRIPTION OF THE DRAWINGS

Referring to the exemplary drawings wherein like elements are numbered alike in the accompanying Figures.

The detailed description explains embodiments of the invention, together with advantages and features, by way of example with reference to the drawings.

DETAILED DESCRIPTION OF THE INVENTION

Although the following detailed description contains many specifics for the purposes of illustration, anyone of ordinary skill in the art will appreciate that many variations and alterations to the following details are within the scope of the invention. Accordingly, the following preferred embodiments of the invention are set forth without any loss of generality to, and without imposing limitations upon, the claimed invention.

An embodiment of the invention, as shown and described by the various figures and accompanying text, provides a luminaire with light emitting diodes (LEDs) that is suitable for replacing a standard A19 light bulb, such as that defined by ANSI C78.20-2003 for example, equipped with a threaded connector, sized and shaped as an Edison E26 medium base defined by ANSI C81.61-2007 or IEC standard 60061-1 (7004-21A-2) for example, suitable to be received in a standard electric light socket, where the driver circuit for the luminaire is self-contained within the A19 profile and may be dimmable.

While an embodiment of the invention described herein depicts an A19 light bulb, it be appreciated that the scope of the invention is not so limited, and also encompasses other types and profiles of light bulbs, such as G25, MR16, R20, R30 and R38, for example.

While an embodiment described herein depicts a certain topology of circuit components for driving the LEDs, it should be appreciated that the disclosed invention also encompasses other circuit topologies falling within the scope of the claims. It should also be appreciated that while embodiments disclosed herein describe the claimed invention in terms of an A19 light bulb envelope or an Edison E26 medium base, the claimed invention is not necessarily so limited.

FIGS. 1-5 depict an example LED luminaire 20 having an intermediate member 22 with an Edison type base 24 (alternatively herein referred to as an electrical connector) with appropriately sized threads 26 sized and shaped to be received in a standard electric light socket. An electrical contact 27 is disposed on one end of the base 24. In an embodiment, base 24 is an Edison E26 medium base. Coupled to the intermediate member 22 is a heat sink 28 that includes a first portion 30 having a plurality of ribs 32 and a second portion 34 extending from one end. Heat sink 28 is in thermal communication with an LED light source 36 to allow dissipation of thermal energy from the luminaire 20. In one embodiment, the heat sink 28 is made from a metal, such as aluminum for example, or a thermally conductive polymer.

A circuit driver 35 is arranged within an interior portion of intermediate member 22. The circuit driver 35 is electrically coupled between the base 24 and the light source 36 to control and provide the desired amount of electrical power to generate light. An optic 54 includes a substantially hollow interior that is disposed about the light source 36 and couples to the heat sink 28. The optic 54 further disperses the light emitted by the light source 36. In an embodiment, the optic 54 is made from a molded polycarbonate or glass material. Alternatively, the optic 54 may include crystalline particulate material, such as borosilicate for example, that is molded into the material. In some embodiments, the optic 54 may also have a variable density, such as by forming the optic 54 in a multistage molding process. The crystalline particulate material and/or variable density increase the amount of diffusion and allows for beam shaping of the emitted light. In some embodiments, the optic 54 is frosted to have a substantially white opaque appearance.

Figure 1:
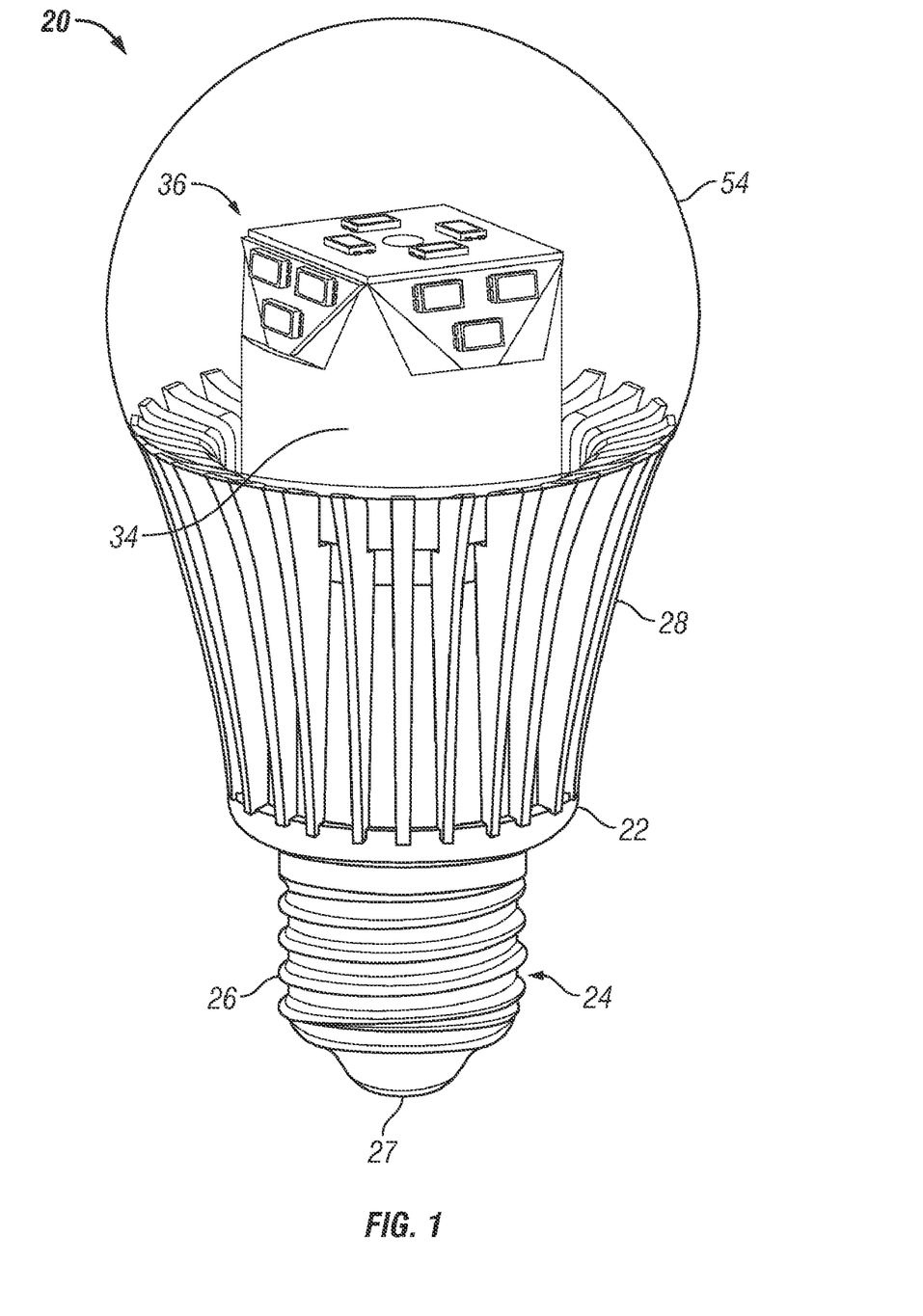
FIG. 1 is a perspective view illustration of a luminaire in accordance with an embodiment of the invention.
Figure 2:
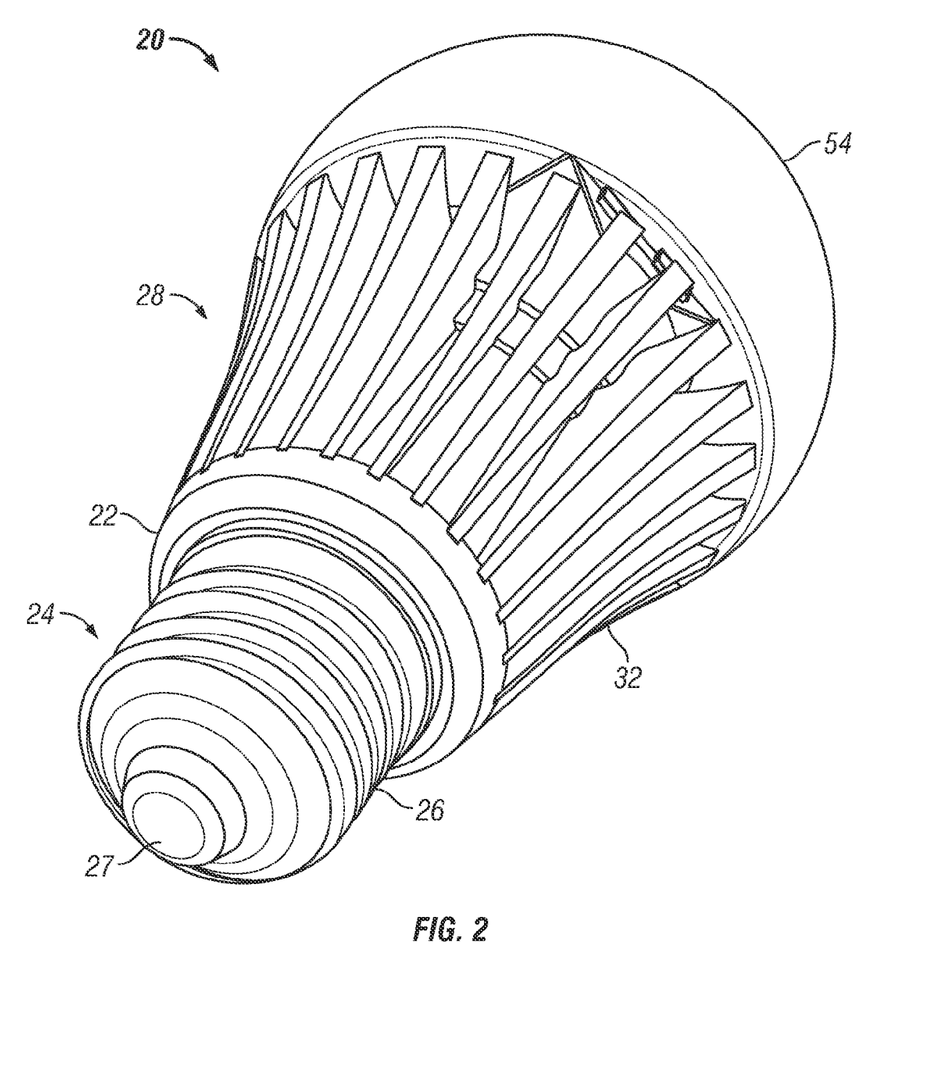
FIG. 2 is another perspective view illustration of the luminaire of FIG. 1.
Figure 3:
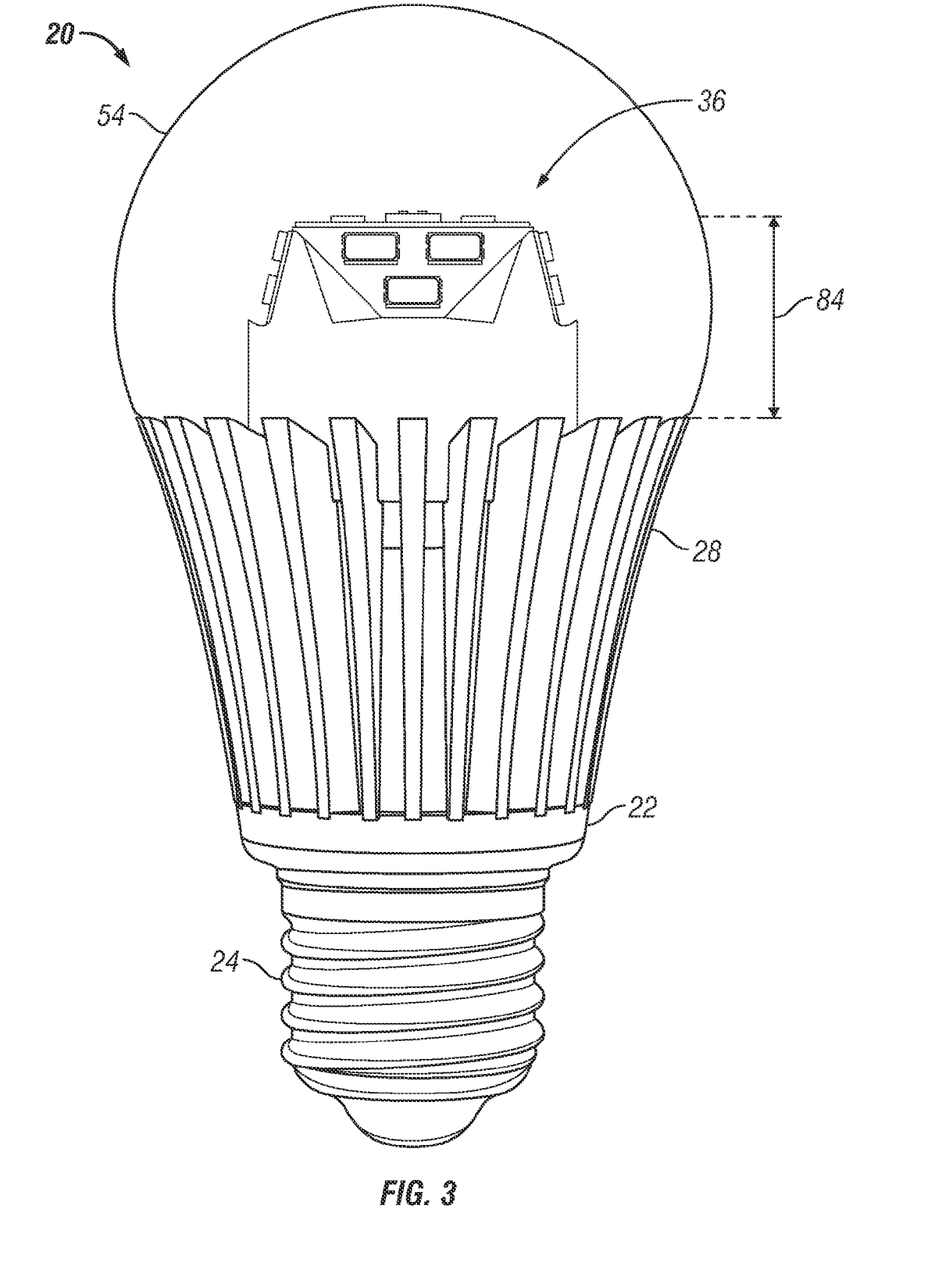
FIG. 3 is a side plan view illustration of the luminaire of FIG. 1.
Figure 4A:
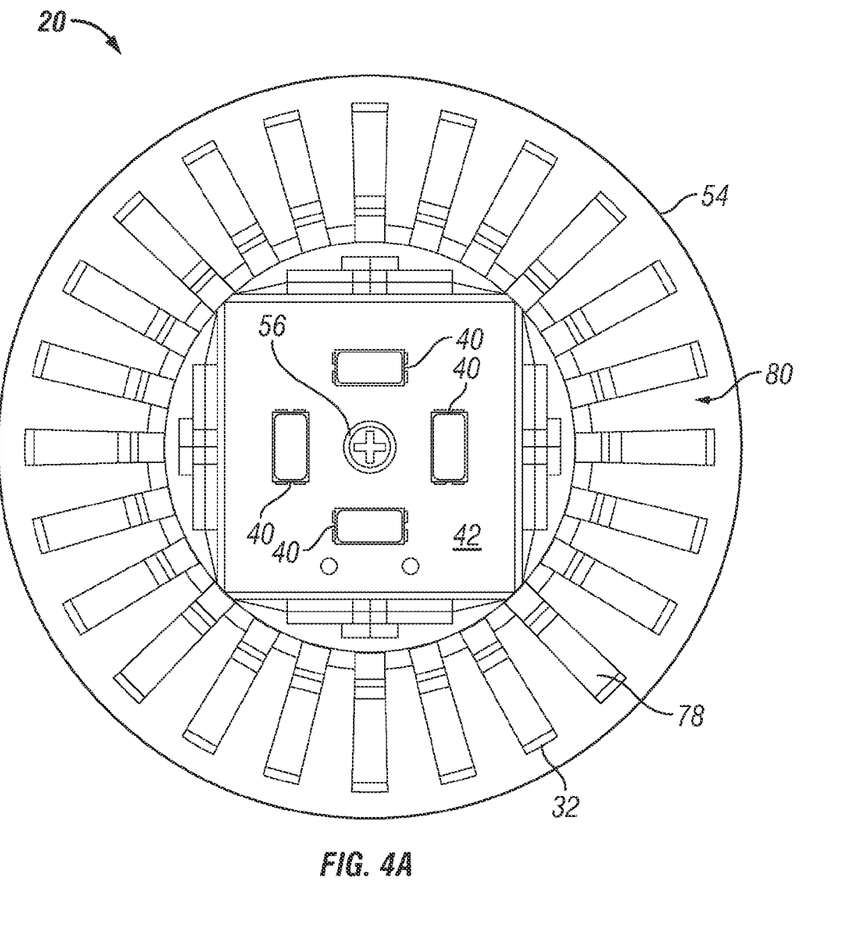
FIG. 4A is a top plan view illustration of the luminaire of FIG. 1.
Figure 4B:
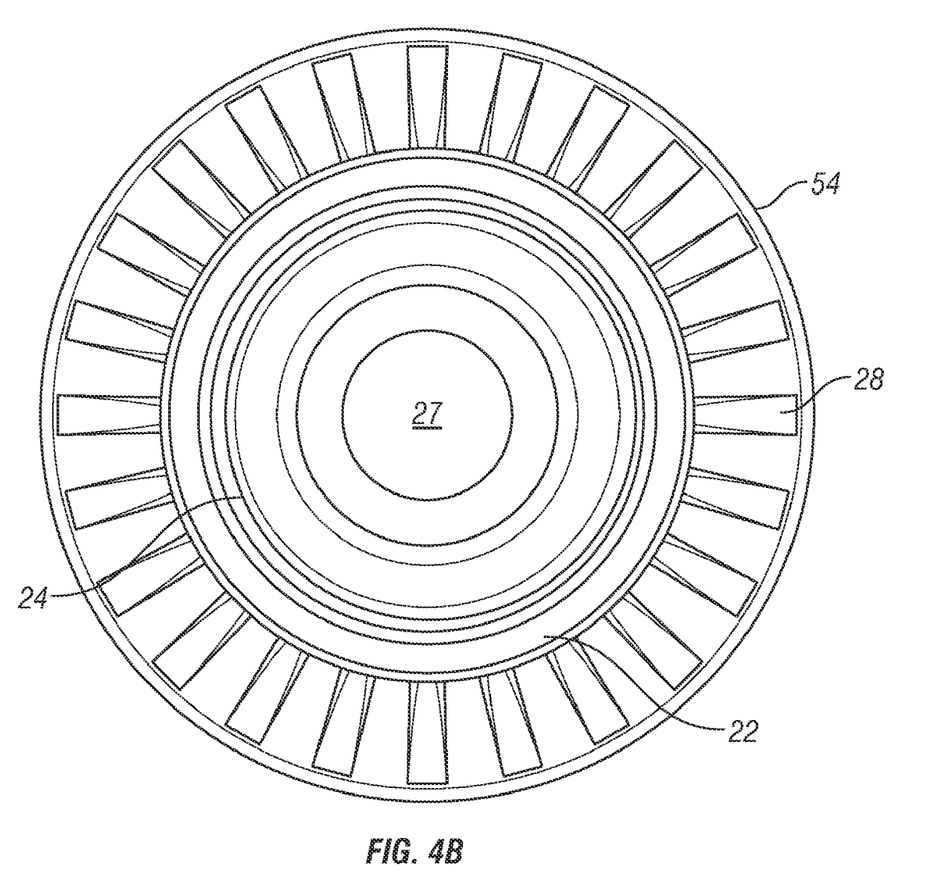
FIG. 4B is a bottom plan view illustration of the luminaire of FIG. 1.
Figure 5:
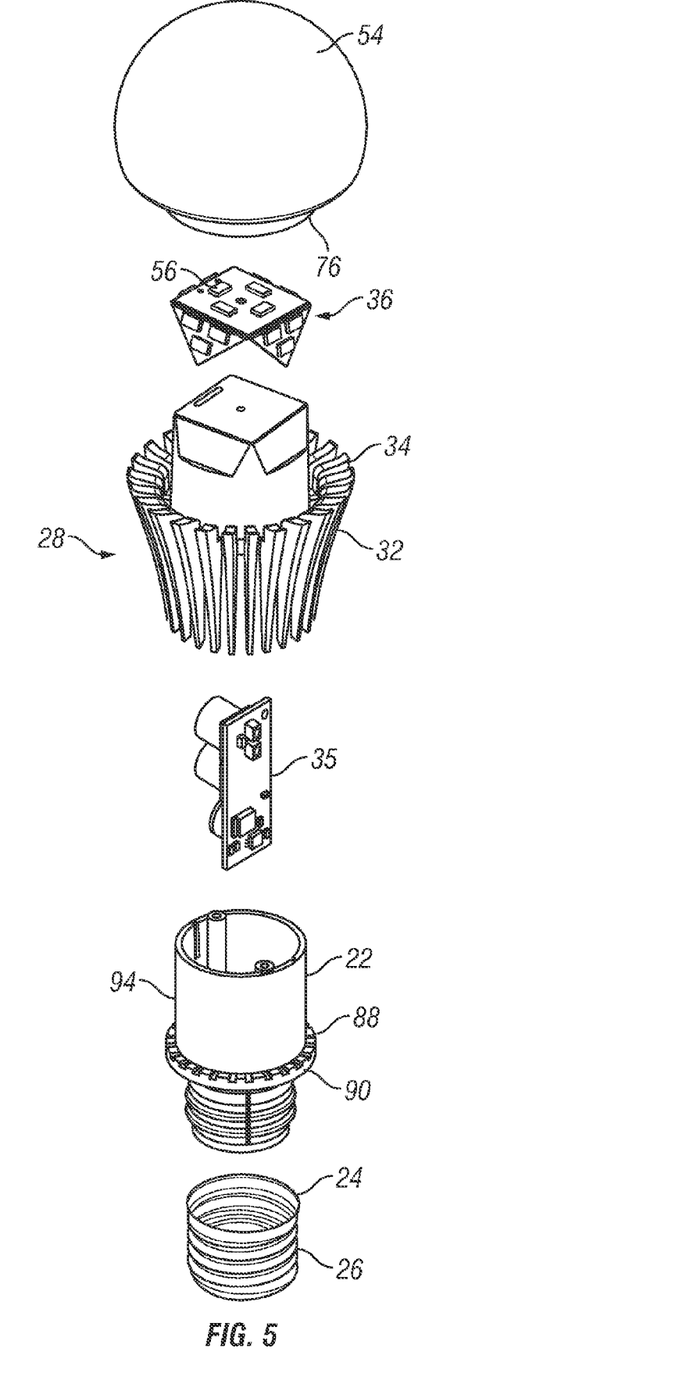
FIG. 5 is an exploded assembly view illustration of the luminaire of FIG. 1.

The light source 36 includes a circuit board 38 having a plurality of LED chips or modules 40 mounted thereon. In an example embodiment, the LED modules 40 are made from a 1/10-millimeter die and emit light over a 120 degree arc. In another embodiment, the LED modules 40 are configured to emit light over a 150-degree arc. In an example embodiment, the light source 36 is a 3.3-volt to 13-volt system. In operation, the driver circuit 35 outputs a signal, analogous to a DC electrical current, to the circuit board 38. The circuit board 38 distributes the signal to the LED members 40. In response to this signal, the LED members 40 generate photons of light that are directed into the optic 54, which diffuses the photons to illuminate the desired area.

Figure 6:
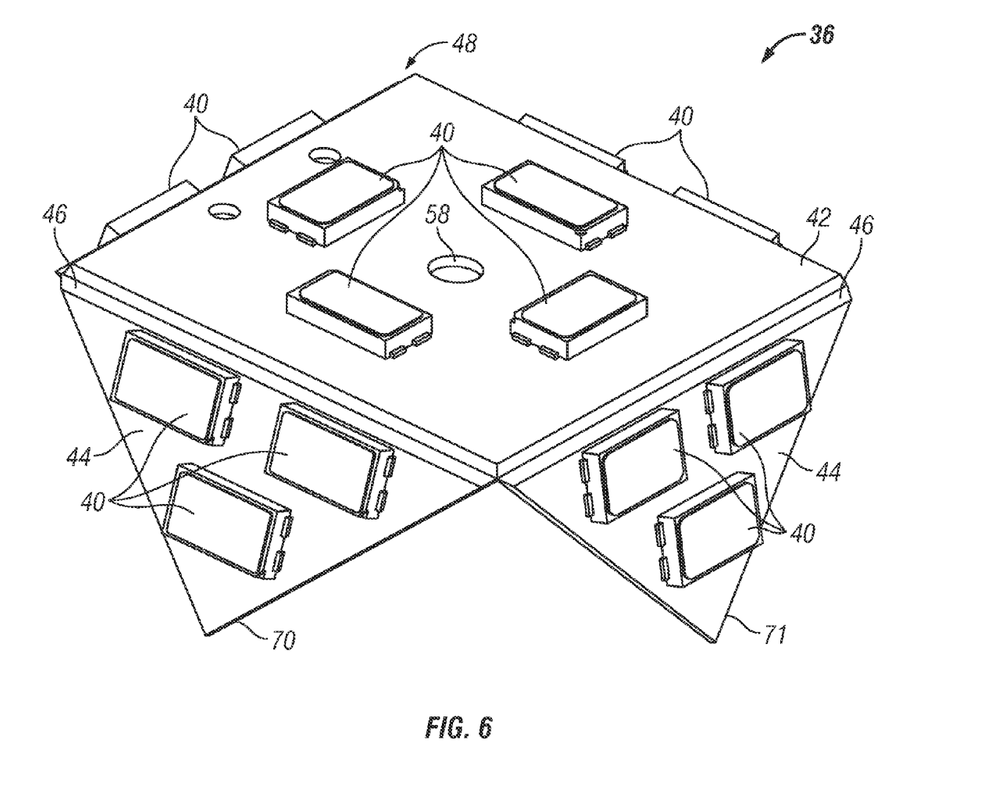
FIG. 6 is a perspective view illustration of an embodiment of a LED assembly for use with the luminaire of FIG. 1.
Figure 7:
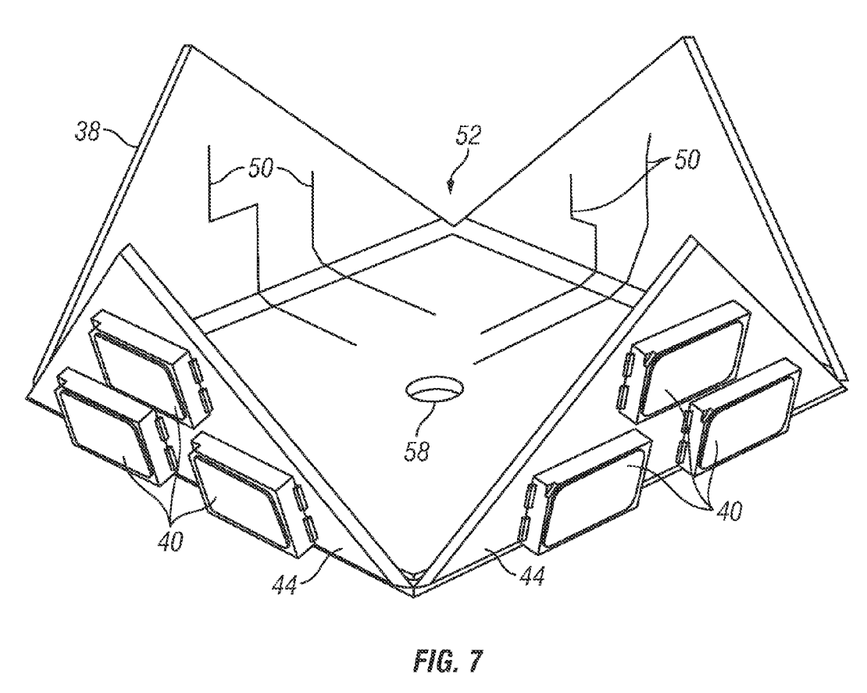
FIG. 7 is another perspective view illustration of the LED assembly of FIG. 6.
Figure 8:
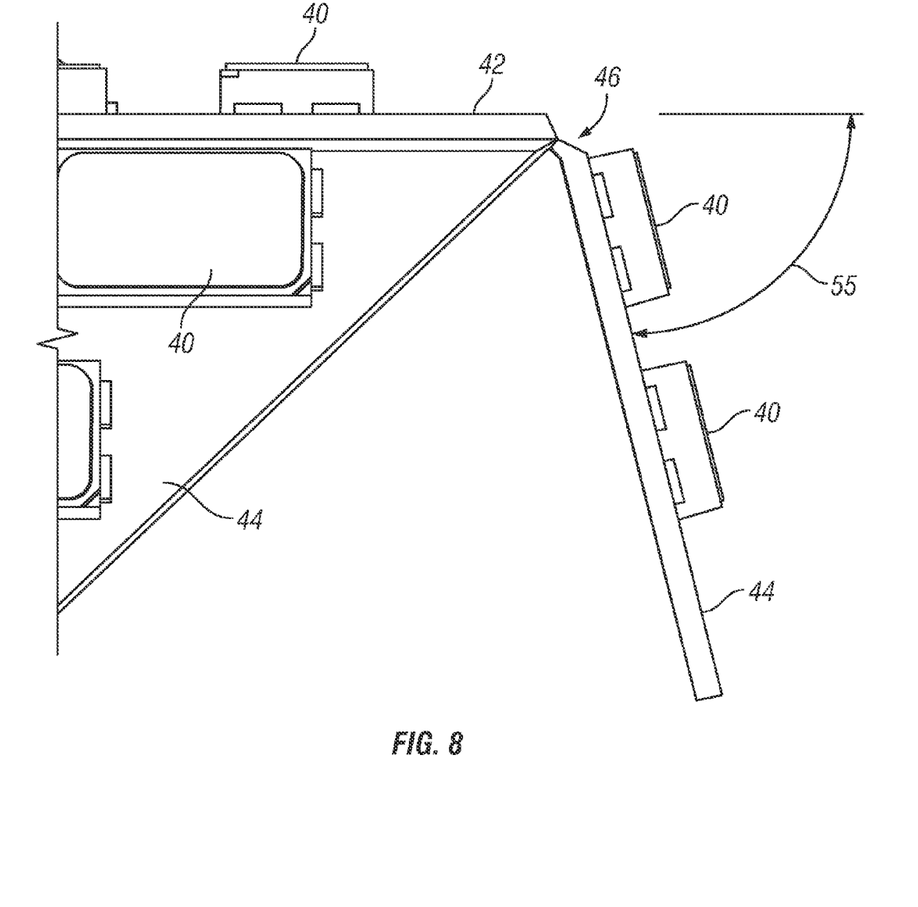
FIG. 8 is a partial side plan view illustration of the LED assembly of FIG. 7.

In one embodiment, the circuit board 38 includes a first surface 42 and a plurality of facets or projections 44 as shown in FIGS. 6-8. Each of the projections 44 includes a first surface adjacent a first side 48 of the light source 36 upon which the LED modules 40 are mounted and a second surface upon which the circuit traces are formed. The plurality of projections 44 are coupled to the first surface 42 by a v-score portion 46. It should be appreciated that while the exemplary embodiment illustrates three LED modules 40 on each surface 44, the claimed invention should not be so limited and a luminaire 20 may have only one LED module 40 per projection 44. Similarly, in other embodiments, each surface 44 may have more than three LED modules 40. Further, in one embodiment, the first surface 42 has no LED modules 40. In one embodiment, the electrical traces 50 that connect the LED modules 40 with circuitry (not shown) are arranged on a second side 52 of the circuit board 38. As will be discussed in more detail below, the arrangement of the electrical traces 50 on the second side 52 provides advantages in allowing the assembly of the light source 36 with the circuit board 38 to be arranged in a planar or flat configuration, or in a non-planar configuration while maintaining a contiguous trace between the projections 44 and the surface 42.

In the exemplary embodiment, the plurality of projections 44 are arranged on an angle 55 relative to the first surface 42 as shown in FIG. 8. It should be appreciated that the first surface 42 may be generally perpendicular to the longitudinal axis of luminaire 20. In the exemplary embodiment, the angle 55 is between 65-85 degrees and 75 degrees is desired. The number of projections 44 may be any number that provides the desired level of light distribution. In the exemplary embodiment, there are four projections 44 which allow an LED module 40 with a 120-degree distribution arc to provide a desired amount of light distribution. In another embodiment, the light source 36 has three projections 44 which allow an LED module 40 with a 150 degree light distribution arc to provide the desired amount of light distribution. In yet another embodiment, the light source 36 has five projections 44. In yet another embodiment, a prismatic lens (not shown) is arranged adjacent the light source 36. The prismatic lens further disburses the emitted light and allows the angle 55 to be reduced to 45 degrees.

Figure 9:
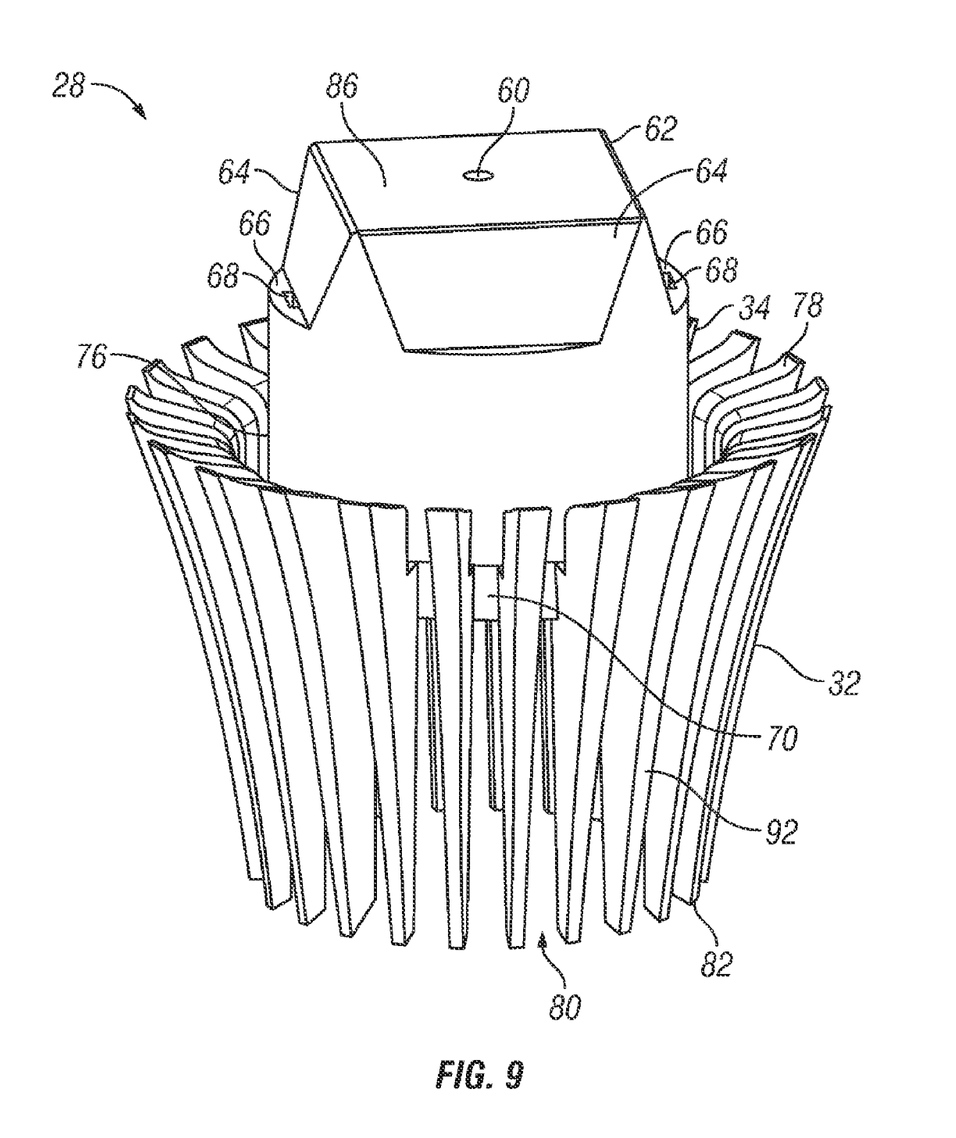
FIG. 9 is a perspective view illustration of a heat sink for use with the luminaire of FIG. 1.
Figure 10:
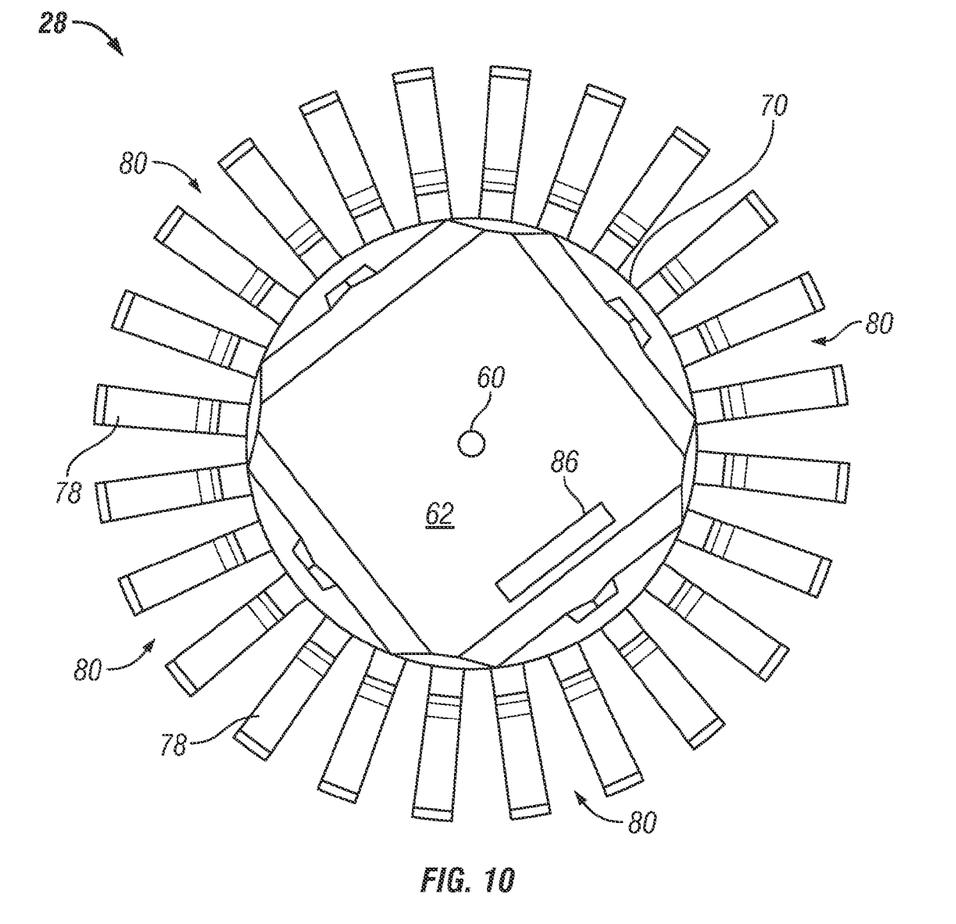
FIG. 10 is a top plan view illustration of the heat sink of FIG. 9.
Figure 11:
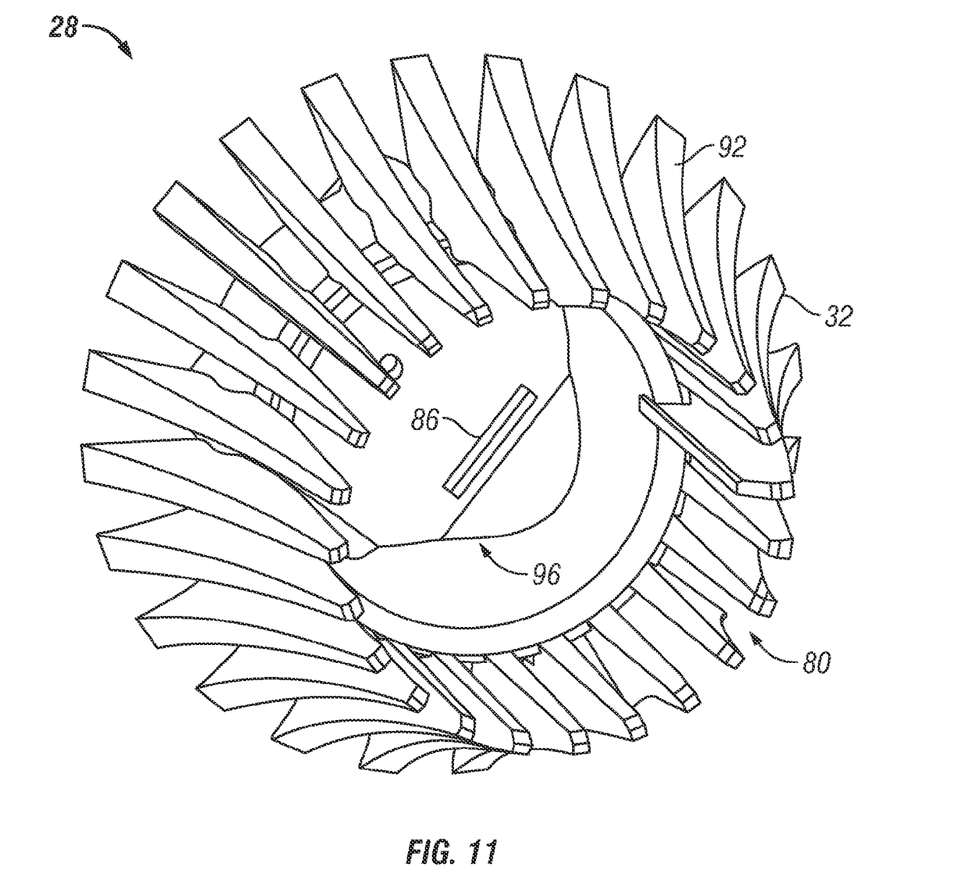
FIG. 11 is a perspective view illustration of the heat sink of FIG. 9.

The light source 36 is disposed in thermal communication with the heat sink 28. In one embodiment, the light source 36 includes an opening 58 in the first surface 42 that allows the light source 36 to be coupled to the heat sink 28 by a fastener 56 such as a screw or a heat spike for example. The fastener 56 is received in an opening 60 in a surface 62 of heat sink 28 as shown in FIGS. 9-11. The opening 60 may include features such as a threaded surface for example that engage the fastener 56. The surface 62 may also include a slot 86 that is sized to allow conductors from the circuit driver 35 to extend into the interior of the heat sink 28.

The surface 62 is sized and shaped to receive the first surface 42. The heat sink 28 second portion 34 further include a plurality of surfaces 64 that are arranged substantially parallel to the plurality of projections 44 of light source 36. The second side 52 of the projections 44 may be arranged in direct contact with the surfaces 64, or an intermediary member such as thermal grease or other similar heat transfer material may be disposed therebetween.

The heat sink 28 may also include a step portion 66 along one edge of each surface 64. In one embodiment, an opening 68 is arranged in the step portion 66 and is sized to receive a corner 71 of the projections 44. It should be appreciated that the openings 68 facilitate the support and retention of light source 36 on the heat sink 28 and also may assist in the transfer of heat to the heat sink 28. The heat sink 28 further includes an intermediate portion 70 at one end of the second portion 34. The intermediate portion 70 couples the plurality of ribs 32 to the second portion 34. Each of the ribs 32 includes a rim area 72, an interior wall portion 74 and a shoulder portion 78. The interior wall portion 74 and the adjacent second portion 34 define a gap 76 that is sized to receive an open end of the optic 54. The shoulder portion 78 is shaped to support the optic 54 when the optic 54 is assembled on the luminaire 20. A contiguously curved outer surface extends between the shoulder portion 78 and the second end 82. In one embodiment, the surface 92 has a frustoconical shape.

In one embodiment, a portion of the ribs 32 extends over a body 94 of the intermediate member 22. When assembled on the intermediate member 22, the second end 82 of each rib 32 is supported within one of a plurality of slots 88 formed on a projection 90 of the intermediate member 22. The interior area 96 of the heat sink second portion 34 has an opening on one end that cooperates with the intermediate member 22 to define a space to contain the circuit driver 35.

The plurality of ribs 32 are disposed about the circumference of the intermediate portion 70 with a plurality of gaps 80 disposed between each pair of ribs 32. The gap 80 extends from the shoulder portion 78 to a second end 82 and is open along the outer diameter of the heat sink 28. In one embodiment, the ribs 32 extend radially from the intermediate portion 70. As the LED modules 40 generate light, heat is generally generated on the backplane of the LED modules 40. In an embodiment, this thermal energy is transferred from the LED modules 40 into the circuit board 38. The thermal energy is conducted from the circuit board 38 and into the heat sink 28. The thermal energy is conducted through the plurality of ribs 32 and dissipated through natural convection to the surrounding environment.

In the exemplary embodiment, the heat sink 28 positions the light source 36 within the optic 54 at a predetermined distance 84 above the shoulder portion 78. The positioning of the light source 36 within the optic 54, the angle 55 of the projections 44, the light distribution arc of the LED module 40 and the gaps 80 cooperate to allow the light source 36 to emit light through the gaps 80 and onto a plane below the heat sink 28. It should be appreciated that this provides advantages in allowing the luminaire to distribute light more evenly about the luminaire and perform substantially similar to an incandescent light bulb. In the exemplary embodiment, the luminaire 20 distributes light at a spherical arc equal to or greater than 250 degrees and in another embodiment the light is distributed in a spherical arc equal to or greater than 270 degrees.

During operation, the luminaire 20 is coupled to a lighting system, such that the electrical contact 27 is disposed to receive electrical current from an AC mains power supply via a switch or dimmer switch. The electrical current flows through the electrical contact 27 into the driver circuit 35, which adapts the input electrical current to have characteristics desirable for operating the LED modules 40. In an example embodiment, the driver circuit 35 includes circuitry for accommodating a dimmable lighting system. In some conventional lighting systems, a dimmer switch may be used to lower the luminosity of the light bulbs. This is usually accomplished by chopping the AC current or in more elaborate systems by stepping down the voltage. Unlike an incandescent light bulb, which can tolerate (to a degree) sudden and large changes in the electrical voltage, the LED device performance will be less than desirable. In this embodiment, the driver circuit 35 includes circuitry for smoothing out the input electrical voltage and current to allow the LED modules 40 to operate without interruption of electrical power at lower luminosity levels.

Figure 12:
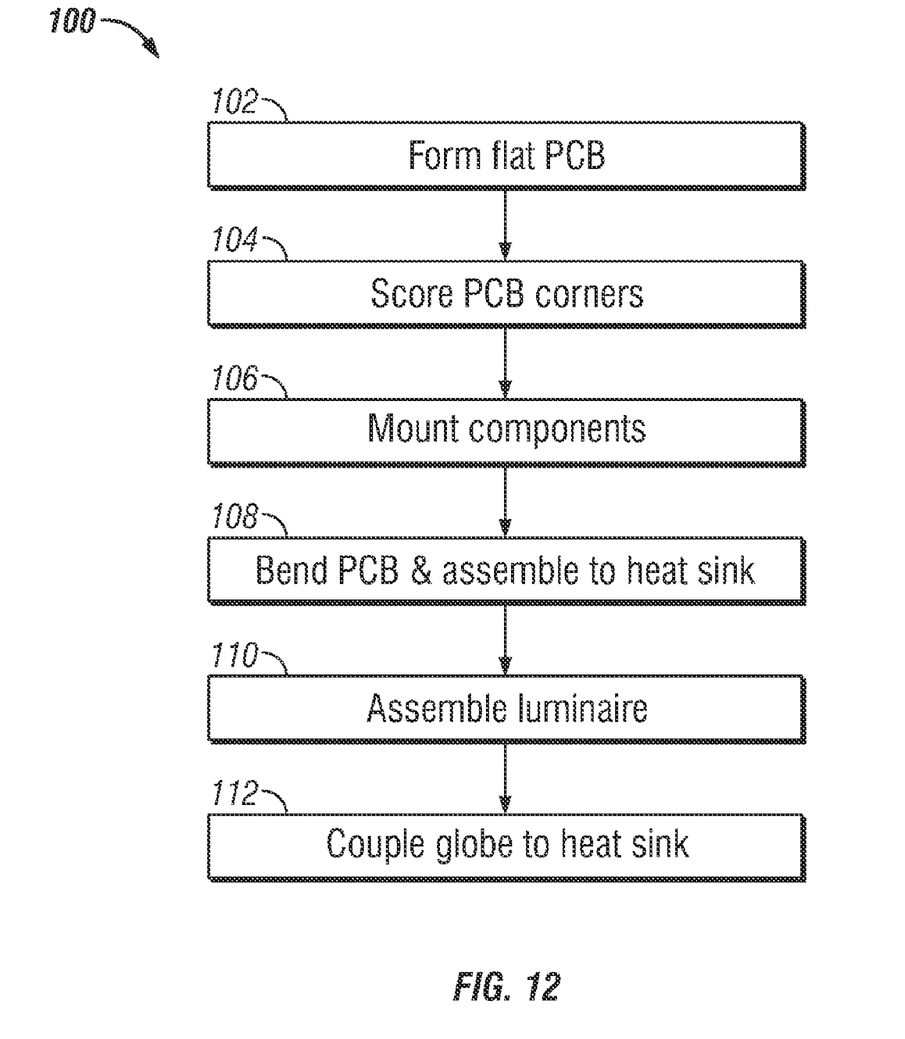
FIG. 12 is a flow diagram of a method of assembling a luminaire in accordance with an embodiment of the invention.

A method of fabricating and assembling the luminaire 20 according to one embodiment is illustrated in FIG. 12. The method 100 initiates in block 102 with the forming of the printed circuit board (PCB) 38 base member in a flat configuration. In one embodiment, the PCB 38 is formed from a fiberglass reinforced epoxy laminate material, such as a National Electrical Manufacturers Association (NEMA) grade FR-4 material for example for example. In the embodiment of FIGS. 1-7, the PCB 38 has a first surface 42 and facets or projections 44. The number of projections 44 may comprise four or three projections for example. The projections may be formed in a triangular, square, rectangular or semi-circular shape for example. The method 100 then proceeds to block 104 where a recess or score-line 46 is formed in the PCB 38 to produce an interface between the first surface 42 and each of the projections 44. In the exemplary embodiment, the score 46 is a "v-score" wherein the recess has a v-shape. It should be appreciated that the score 46 is formed sufficiently deep to form what is sometimes referred to as a "living hinge" that allows the projection 44 to flex relative to the first surface 42. Further, the score 46 is also shallow enough such that the material between the projection 44 and the surface remains contiguous. As such the score 46 does not interfere with the traces 50 that will be formed on the second side 52 of the PCB 38.

With the scores 46 formed and the PCB 38 still in a flat configuration, the method 100 proceeds to block 106. In block 106, the components such as the LED modules 40 are assembled on to the PCB 38 and traces 50 are formed on the second side 52. The LED modules 40 may be a single discrete LED device or an array of LED devices. In one embodiment, the LED modules 40 are assembled on to the projections 44. In another embodiment, the LED modules 40 are assembled onto the projections 44 and first surface 42. In one embodiment, there are multiple LED modules 40 assembled on each projection 44. In yet another embodiment, there is a single LED module 40 assembled on each projection 44. It should be appreciated that the assembling of components and traces with the PCB in a flat configuration provides advantages in lowering manufacturing costs and increasing the reliability of the PCB 38.

Once the components have been assembled, the method 100 proceeds to block 108 where the flat PCB 38 is placed on the heat sink 28 and the projections 44 are flexed or bent into a position against the surfaces 64 of the heat sink 28. In one embodiment, the corner 71 of each projection 44 is inserted into the opening 68 in the heat sink 28 to assist in retaining the projections 44 in the desired position. In one embodiment, the projections 44 of PCB 38 are bent to the desired position prior to assembly of the PCB 38 on the heat sink 28. With the PCB 38 and heat sink 28 assembled, the method 100 proceeds to block 110 where the PCB/heat-sink assembly is assembled with the remainder of the luminaire 20, including electrically coupling the PCB 38 to the circuit driver 35 and the coupling of the intermediate member 22 and base 24 with the heat sink 28. Finally, in block 112, the optic 54 is coupled to the heat sink 28 to form the luminaire 20.

From the foregoing, it will be appreciated that the Edison base 24, optic 54 and heat sink 28 of luminaire 20, collectively may have a profile so configured and dimensioned as to be interchangeable with a standard A19 light bulb, and the driver circuit 35 and the LED light source 36 may be so configured and dimensioned as to be disposed within the A19 profile.

As disclosed, some embodiments of the invention may include some of the following advantages: a LED luminaire usable as a direct replacement for incandescent light bulbs in existing lighting systems; a LED luminaire having lower energy usage, increased heat diffusion, and/or increased luminosity with respect to an incandescent bulb having a similar lumen rating or with respect to a prior art LED luminaire having a similar operational power rating; a LED luminaire that transmits light to a plane below the luminaire, and, an LED luminaire that creates a light output distribution having a similar appearance to an incandescent bulb.

The particular and innovative arrangement of components according to the invention therefore affords numerous not insignificant technical advantages in addition to an entirely novel and attractive visual appearance.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best or only mode contemplated for carrying out this invention, but that the invention will include all embodiments falling within the scope of the appended claims. Also, in the drawings and the description, there have been disclosed exemplary embodiments of the invention and, although specific terms may have been employed, they are unless otherwise stated used in a generic and descriptive sense only and not for purposes of limitation, the scope of the invention therefore not being so limited. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

What is claimed is:

1. A luminaire, comprising:
an electrical base;
a driver circuit in electrical communication with the electrical base;
an optic;
a heat sink disposed between the electrical base and the optic, the heat sink having a plurality of first surfaces, each of the plurality of first surfaces being disposed non-planar with respect to each other; and,
a light emitting diode (LED) light source having a plurality of second surfaces disposed non-planar with respect to each other and disposed in thermal communication with a respective one of the plurality of first surfaces, the LED light source further having a plurality of third surfaces opposite the plurality of second surfaces and having at least one LED member coupled thereon, each LED member being disposed in electrical communication with the driver circuit, the LED light source further comprising a fourth surface that is substantially perpendicular with a longitudinal axis of the luminaire, and the plurality of second surfaces are contiguous with and extend from the fourth surface via respective ones of a plurality of living hinges.

2. The luminaire of claim 1 wherein the plurality of third surfaces are disposed on an angle of 45-85 degrees relative to a plane substantially perpendicular to a longitudinal axis of the luminaire.

3. The luminaire of claim 2 wherein the plurality of third surfaces are disposed on a 75 degree angle relative to the plane.

4. The luminaire of claim 2 wherein the optic includes a prismatic lens and the plurality of third surfaces are disposed on a 45 degree angle relative to the plane.

5. The luminaire of claim 1 wherein the plurality of third surfaces includes four surfaces and each of the LED members emits light on a 120 degree arc.

6. The luminaire of claim 1 wherein the plurality of third surfaces includes three surfaces and each of the LED members emits light on a 150 degree arc.

7. The luminaire of claim 1 wherein the plurality of second surfaces each include at least one circuit trace member that extends from each of the plurality of second surfaces to the fourth surface.

8. The luminaire of claim 1 wherein the heat sink includes a plurality of ribs with a plurality of gaps disposed therebetween, wherein the plurality of third surfaces are positioned such that a portion of light emitted from each of the at least one LED members are transmitted through the plurality of gaps.

9. A luminaire comprising:
an electrical base;
an optic;
a heat sink coupled between the electrical base and the optic, the heat sink having a first surface on one end within the optic and a plurality of second surfaces disposed about the first surface wherein the plurality of second surfaces are on an 45-85 degree angle relative to the first surface; and,
an LED light source having a plurality of third surfaces disposed parallel to the plurality of second surfaces, the plurality of third surfaces being thermally coupled to the plurality of second surfaces, the LED light source further having a plurality of LED members operably coupled to the plurality of third surfaces, wherein at least one of the plurality of LED members is associated with each of the plurality of third surfaces, the LED light source further comprising a fourth surface that is substantially perpendicular with a longitudinal axis of the luminaire, and the plurality of third surfaces are contiguous with and extend from the fourth surface via respective ones of a plurality of living hinges.

10. The luminaire of claim 9 wherein the plurality of second surfaces are each disposed on a 65-85 degree angle relative to the first surface.

11. The luminaire of claim 10 wherein the plurality of second surfaces is disposed on substantially a 75 degree angle relative to the first surface.

12. The luminaire of claim 9 wherein:
the optic includes a prismatic lens; and,
wherein the plurality of second surfaces are each disposed on substantially a 45 degree angle relative to the first surface.

13. A luminaire comprising:
an electrical base;
an optic;
a heat sink coupled between the electrical base and the optic, the heat sink having a first portion disposed within the optic and a second portion having a plurality of ribs, the first portion having a plurality of first surfaces disposed at substantially a 45-85 degree angle relative to a plane perpendicular to a longitudinal axis; and,
an LED light source thermally coupled to the heat sink, the LED light source comprising a printed circuit board (PCB) and a plurality of LED members, the PCB having at least three second surfaces, each of the at least three second surfaces being disposed at an angle substantially parallel to and in thermal contact with one of the plurality of first surfaces.

14. The luminaire of claim 13 wherein the PCB includes a fourth surface parallel to the plane and at least three score portions, each of the at least three score portions being disposed between one of the at least three second surfaces and the fourth surface.

15. The luminaire of claim 14 wherein the plurality of LED members are disposed on each of the at least three second surfaces and the fourth surface.

16. The luminaire of claim 13 wherein:
the heat sink includes a plurality of openings adjacent the plurality of first surfaces; and,
each of the at least three second surfaces includes a portion, each of the portions being disposed in one of the plurality of openings.

17. A method of fabricating an LED assembly for a luminaire comprising:
forming a flat PCB having a first side and a second side;
scoring the flat PCB on the first side to define a plurality of surfaces, wherein the scoring includes forming a v-score;
forming electrical traces on the second side of the flat PCB across the v-score;
mounting a plurality of LED members to the flat PCB, wherein at least one of the plurality of LED members is mounted to each of the plurality of surfaces;
bending the plurality of surfaces to a predefined angle at the respective v-score; and,
mounting the PCB to a heat sink.

18. The method of claim 17 wherein the step of mounting the PCB to the heat sink includes the step of inserting a portion of the plurality of surfaces into one of a plurality of openings in the heat sink.

* * * * *

UNITED STATES PATENT AND TRADEMARK OFFICE
CERTIFICATE OF CORRECTION

| | | |
|---|---|---|
| PATENT NO. | : 8,272,762 B2 | |
| APPLICATION NO. | : 13/247117 | |
| DATED | : September 25, 2012 | |
| INVENTOR(S) | : Fredric S. Maxik et al. | |

It is certified that error appears in the above-identified patent and that said Letters Patent is hereby corrected as shown below:

In the Specifications:

In column 6, line 37, after "for example" delete "for example"

Signed and Sealed this
Third Day of September, 2013

Teresa Stanek Rea
*Acting Director of the United States Patent and Trademark Office*